United States Patent [19]

Linn

[11] Patent Number: 5,816,472

[45] Date of Patent: Oct. 6, 1998

[54] BONDING TOOL FOR TAPE AUTOMATED ASSEMBLY

[75] Inventor: Lawrence E. Linn, Timnath, Colo.

[73] Assignee: Hewlett-Packard Company, Palo Alto, Calif.

[21] Appl. No.: 521,196

[22] Filed: Aug. 30, 1995

Related U.S. Application Data

[63] Continuation-in-part of Ser. No. 188,282, Jan. 28, 1994, abandoned.

[51] Int. Cl.$^6$ ..................................................... B23K 20/10
[52] U.S. Cl. ............................................. 228/1.1; 228/4.5
[58] Field of Search ....................................... 228/1.1, 4.5

[56] References Cited

U.S. PATENT DOCUMENTS

| | | | |
|---|---|---|---|
| 3,750,926 | 8/1973 | Sakamoto et al. | 228/1.1 |
| 4,030,657 | 6/1977 | Scheffer | 228/1.1 |
| 4,315,128 | 2/1982 | Matcovich et al. | 228/4.5 |
| 4,776,509 | 10/1988 | Pitts et al. | 228/1.1 |
| 5,147,082 | 9/1992 | Krause et al. | 228/1.1 |
| 5,180,093 | 1/1993 | Stansbury et al. | 228/1.1 |

FOREIGN PATENT DOCUMENTS

| | | |
|---|---|---|
| 0506112A1 | 3/1992 | European Pat. Off. . |
| 2285943 | 1/1995 | United Kingdom . |

OTHER PUBLICATIONS

M.K. Avedissian, "Multidirectional Ultransonic Wire Bonding Tip," *Western Electric Tech. Dig.*, No. 20, Oct. 1970, pp. 7–8.

"Bonding Capillaries for Thermosonic or Thermocompression Gold Wire Bonding," Small Precision Tools, Petaluma, CA, 1988.

*Primary Examiner*—P. J. Ryan
*Assistant Examiner*—Jeffrey T. Knapp
*Attorney, Agent, or Firm*—Cynthia S. Baan

[57] ABSTRACT

A bonding tool for use in tape automated bonding and wedge bonding of gold and gold plated leads or wires to contact pads of electronic devices is fabricated of Aluminum Oxide ceramic without electrically conductive metallic binders. The bonding tool has a microscopically rough surface that is brought into compressive contact with the gold leads or wires and manipulated ultrasonically or thermosonically in order to form a molecular bond between the gold lead or wire and the contact pad of the electronic device. The Aluminum Oxide ceramic bonding tool is sufficiently hard that it does not readily deform under normal ultrasonic bonding conditions and is not readily abraded by the gold leads.

6 Claims, 5 Drawing Sheets

BONDING TOOL FOR TAPE AUTOMATED ASSEMBLY

CROSS REFERENCE TO RELATED APPLICATIONS

This is a continuation-in-part of application Ser. No. 08/188,282, now abandoned, which is incorporated herein by reference for all that it teaches.

FIELD OF THE INVENTION

This invention pertains generally to the field of tape automated bonding (TAB) and, more particularly, to a process and tool for forming a TAB inner lead bond.

BACKGROUND OF THE INVENTION

In the manufacture of electronic devices, such as semiconductor integrated circuits (IC's), input, output, power and ground pads must be bonded or coupled to external leads. One technique known in the technology is tape automated bonding (TAB), which is well known to persons of ordinary skill in the field of semiconductor fabrication. As shown in FIG. 1, this fabrication procedure utilizes a continuous insulated tape 14 which is similar to photographic film to provide a planar substrate for chips 26 that are attached to individual sections, or frames, of the tape 14. This procedure could be done equally as well using singulated frames, rather than frames attached to tape 14. A spider-like metal (generally copper plated with gold) pattern of conductive traces 20, 21 and 22 is etched on each frame. The traces may either "fan out", i.e. radiate from the center of the frame to the four edges, or may be four sets of parallel lines, with each set extending perpendicular from one edge of a chip 26. The chip 26 is carefully aligned over the center of the frame so that the contact pads 28 (usually aluminum) of the chip 26 are precisely located at corresponding conductive trace pads 24 in the central portion of the frame. The chip 26 is then attached to the tape automated bonding frame.

This connection of the chip pad 28 to the conductive trace pads 24 of the frame is referred to as "inner lead bonding", which is performed via ultrasonic bonding or thermosonic bonding techniques. All of these bonding techniques are accomplished by bringing a bonding tool 32 into contact with conductive trace pads 24 of a frame. Once the bonding tool 32 is in contact with a trace pad 24, ultrasonic or thermosonic bonding is then carried out for that particular chip pad 28 and conductive trace pad 24. The contact end 34 must have a microscopically patterned, rough surface so that when the tool 32 comes into contact with the gold lead 24, the tool will "grab" the lead. Accordingly, when thermosonic or ultrasonic energy is applied to the tool 32, it will grab the gold lead 24 and move it across the aluminum bonding pad 28. This ultrasonic motion causes a molecular bond to form between the gold lead 24 and the aluminum pad 28.

Bonding tool 32 is generally made of sintered titanium carbide or tungsten carbide in an electrically conductive, metallic binder—typically nickel. The carbide gives the tool 32 its hardness, while the electrically conductive metal (binder) is needed because the tool is manufactured using an electrodischarge machining process. In the manufacturing of the tool 32, a master tool is made of tool steel using standard precision machining techniques. This master tool is pressed into a soft copper blank to create an electrode, which is then used to form the contact end 34 of the tool 32 using conventional electrodischarge machining procedures.

While this process for making a bonding tool 32 is very efficient and cost effective for precision tool manufacturers, it does not create a superior tool. The contact end 34 of tools that are made by this manufacturing method are prone to quite rapid erosion in the presence of gold on the bonding leads under normal thermosonic bonding conditions. Gold from the bonding leads also tends to build up on the surface of the bonding tool. The inventor has discovered that under ultrasonic conditions, the gold in leads 24 attacks and diffuses into the metal in the bonding tool 32, causing the tool 32 to lose its shape after a relatively few bonds. This condition is very unfavorable for mass production of integrated circuits, which can have several hundred I/O pads. A typical bonding tool generally keeps its original shape for 100 or so bonds, and then has to be changed for a new tool. Tools made by the current manufacturing techniques must be changed frequently, which makes the manufacturing of integrated circuits more expensive.

Although some tool manufacturers claim to make ceramic, diamond or alloy tools that resist ablation by gold, the inventor has discovered that these tools have metallic binders that permit electrodischarge machining. Generally, tool manufacturers use nichol, titanium, tungsten, or copper as a binder material to "glue" small diamonds, saphire or other hard material to the bonding tips of their tools. For example, Deweyl Tool Company, Inc. of Novato, Calif. advertises a "ceramic super tool" and Small Precision Tools of Petaluma, Calif. advertises a "diamond tab tool", however, the inventor has found that these tools have metallic binders and do not resist wear significantly better than the traditional titanium carbide or tungsten carbide tools.

SUMMARY OF THE INVENTION

It is an object of the present invention to provide an improved bonding tool and a method of fabricating a bonding tool wherein the bonding tool and method of fabricating the bonding tool allow the bonding tool to keep its shape for a significantly greater number of bonds than bonding tools of the prior art. In particular, the bonding tool of the present invention is able to maintain its shape for approximately 500,000 bonds before any deformation or degradation is noticed. As bumpless bonding requires the tool to grab the lead and ultrasonically move the lead across the bonding pad, it is more important in bumpless bonding for the tool to maitain a rough surface on the bonding tip. Accordingly, the tool of the present invention works especially well for bumpless bonding.

It is another object of the present invention to provide a bonding tool that is omnidirectional (e.g., can be used to bond in any direction, regardless of the direction of the gold leads). This is accomplished by supplying a bonding tool with a bonding tip with a raised pattern that is substantially the same from any direction. For example, a bonding tool with a raised bonding ring.

The above and other objects of the present invention have been met by a bonding tool that does not contain electrically conductive metallic material, but rather is fabricated from substantially pure sintered aluminum oxide ceramic ($Al_2O_3$). The present invention may also be used to fabricate bonding tools for other types of bonding techniques where the bonding tool comes into contact with gold or gold plated leads, such as a gold wedge bonding tool.

Other objects, features and advantages of the present invention will become apparent upon consideration of the following detailed description and the accompanying drawings, in which like reference designations represent like features throughout the Figures.

DETAILED DESCRIPTION OF THE PRESENT INVENTION

Figure 1:
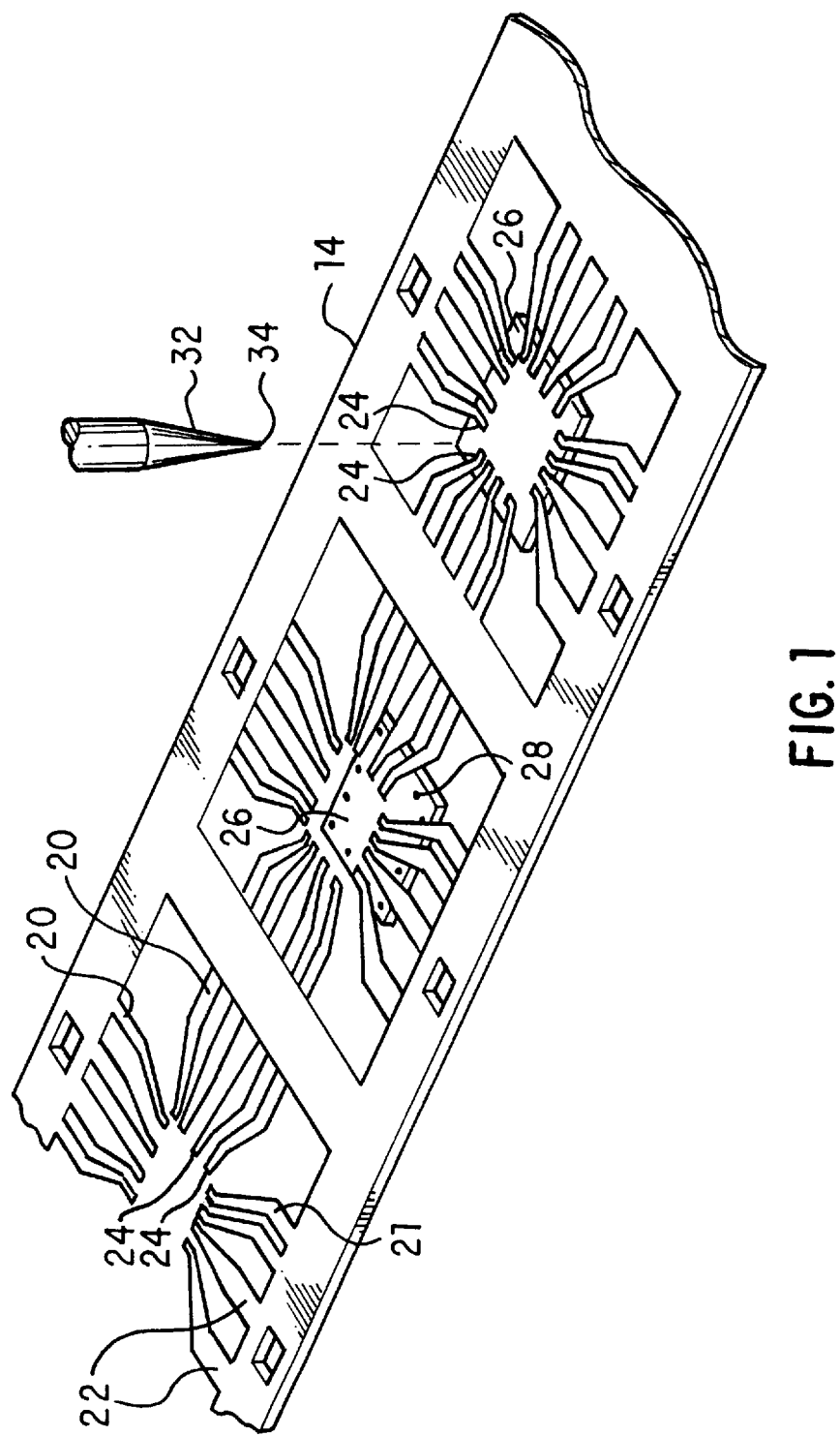
FIG. 1 shows a perspective view of a conventional tape automated bonding process, including a tape, its placement over an integrated circuit chip and a bonding tool.
Figure 2A:
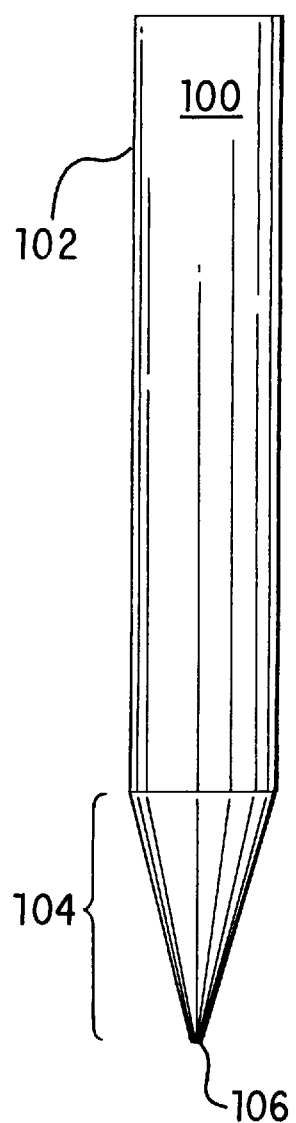
FIG. 2A shows a magnified side cut-away view of a bonding tool according to a first embodiment of the present invention.
Figure 2B:
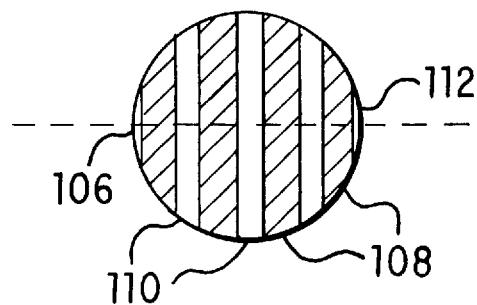
FIG. 2B shows a greatly magnified view of an end tip surface of a bonding tool according to the first embodiment of the present invention.
Figure 2C:
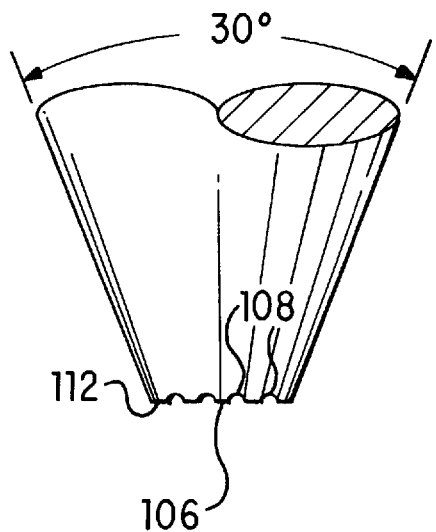
FIG. 2C shows a greatly magnified side cut-away view of the end tip of a bonding tool according to the first embodiment of the present invention.

Reference is made now in detail to a specific embodiment of the present invention, which illustrates the best mode presently contemplated by the inventor(s) for practicing the invention. Alternative embodiments are also briefly described as applicable. Referring now to FIGS. 2A–2C, a bonding tool 100 made of substantially pure sintered aluminum oxide ceramic without metallic binders, according to a first embodiment of the present invention, is shown. In a preferred embodiment, bonding tool 100 is made of 99.99% pure $Al_2O_3$, which is available by Small Precision Tools, 1330 Clegg Street, Petaluma, Calif., 94954. Bonding tool 100 is comprised of a cylindrical shank body portion 102 having a diameter of approximately 0.0624±0.0001 inches and a conical end portion 104. The entire length of bonding tool 100 is approximately 0.470±0.005 inches. Conical end portion 104 terminates at contact end surface 106, which has a diameter of approximately 0.004±0.0003/–0 inches. As shown in FIGS. 2B and 2C, contact end surface 106 comprises three substantially flat, inner contact regions 110 that are approximately 0.0004 inches wide and two substantially flat, outer contact regions 112 that are approximately 0.0002 inches wide. Contact regions 110 and 112 are separated by grooves 108, which are approximately 0.0006±0.0001 inches wide and approximately 0.0003±0.0001 inches deep.

During fabrication, an Aluminum Oxide (Alumina) ceramic, cylindrical blank with a tapered end portion 104, is made by well known molding and sintering processes. The taper being at approximately a 30° included angle. Then the cylindrical blank is ground and lapped to form the final shape and size. The blank is then cut with a laser or diamond saw to the specified length. Next, grooves 108 are formed in contact end surface 106 using diamond saw or laser machining techniques. Also, as will be apparent to those of ordinary skill in the art, other hard materials, such as monocrystalline sapphire could be used for fabricating the bonding tool, as long as no metallic binders are used.

Figure 3A:
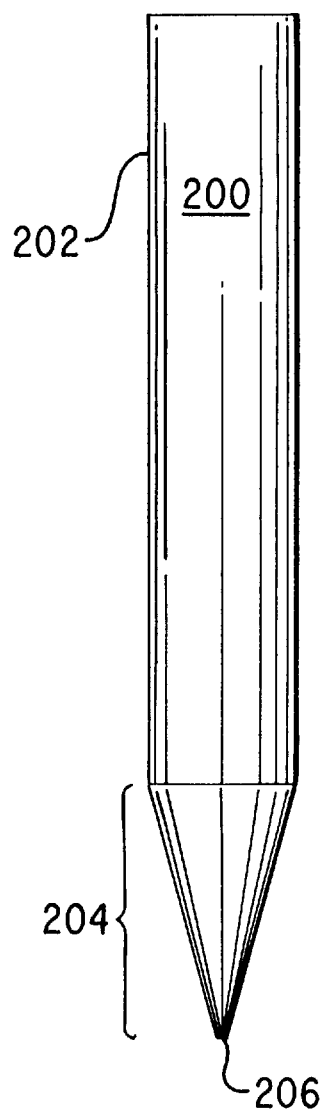
FIG. 3A shows a magnified side cut-away view of a bonding tool according to a second embodiment of the present invention.
Figure 3B:
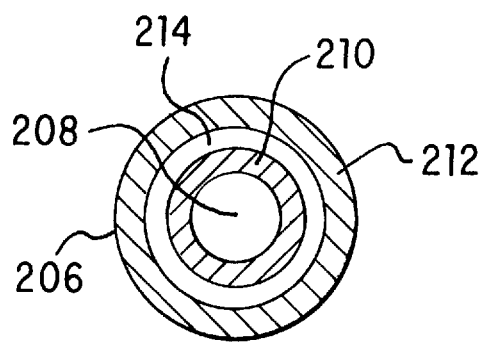
FIG. 3B shows a greatly magnified view of an end tip surface of a bonding tool according to the second embodiment of the present invention.
Figure 3C:
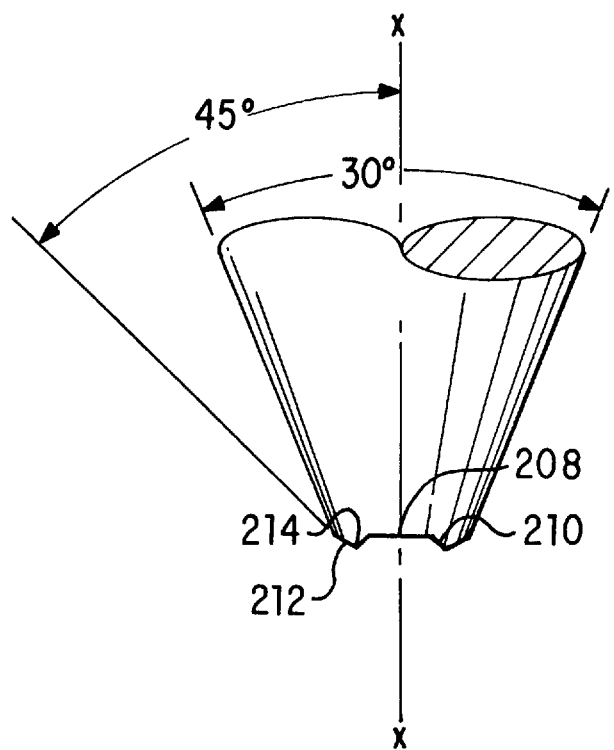
FIG. 3C shows a greatly magnified side cut-away view of the end tip of a bonding tool according to the second embodiment of the present invention.

Referring now to FIGS. 3A–3C, a bonding tool 200 made of substantially pure sintered Aluminum Oxide ceramic without metallic binders, according to a second embodiment of the present invention, is shown. In a preferred embodiment, bonding tool 200 is made of 99.99% pure $Al_2O_3$. Bonding tool 200 is comprised of a cylindrical shank body portion 202 having a diameter of approximately 0.0624±0.0001 inches and a conical end portion 204. The entire length of bonding tool 200 is approximately 0.470±0.005 inches. Conical end portion 204 terminates at contact end surface 206. As shown in FIGS. 3B and 3C, contact end surface 206 comprises a substantially flat contact ring 214 that has an outer diameter of approximately 0.0046 inches and an inner diameter of approximately 0.0042 inches. As shown in FIG. 3C, contact ring 214 is a circular mesa structure having a height of approximately 0.0008 inches above a valley region 208, which has a diameter of approximately 0.0026 inches.

During fabrication, an Aluminum Oxide (Alumina) ceramic, cylindrical shank with a tapered end portion 204, is made by well known molding and sintering processes. The taper being at approximately a 30° included angle. The tapered end portion 204 includes sloped wall 212, which is at approximately a 45° angle from the center axis XX. Then the cylindrical blank is ground and lapped to form the final shape and size. The shank is then cut with a laser or a diamond saw to the specified length. Valley region 208 in end portion 204 is formed using an ultrasonic machining process or a grinding process.

This bonding tool is considered to be superior, because the contact end is omnidirectional. Therefore, the direction of the tool with regard to the direction of the device to be bonded is irrelevant. Accordingly, it is unnecessary to align the direction of the contact end mesa(s) to be perpendicular with the direction of the lead fingers, which would be necessary for bonding tools of the prior art and the first embodiment of the present invention. Such an alignment procedure requires all of the lead fingers in one direction to be bonded and then the bonding tool must be realigned before the lead fingers in the opposite direction (or any other direction) can be bonded.

Once the bonding tool of the present invention is fabricated, it can be used in the same bonding machines and in the same manner that other bonding tools are used for TAB bonding—with two exceptions. First, the Alumina bonding tool of the present invention has a useful bonding life span of more than 500,000 bonds, in contradistinction with the useful life span of conventional bonding tools of just a few hundred bonds. Second, the bonding tool of the second embodiment of the present invention does not require the precise alignment with the lead fingers of the device to be bonded that bonding tools of the prior art require. It will be readily evident to one of ordinary skill in the art that the dimensions of the bonding tools will necessarily change with the intended use and the bonding machine to be used.

The foregoing description of the present invention has been presented for purposes of illustration and description. It is not intended to be exhaustive or to limit the invention to the exact embodiments disclosed, and other modifications and variations may be possible in light of the above teachings. For example, the bonding tool of the present invention does not have to be Aluminum Oxide ceramic, but can be any hard material, such as ruby or sapphire, so long as the binder material used is not nickel or any other material that is readily abraded by gold (usually metallic binder materials are readily abrated by gold). Also, the teachings of the present invention may be used for bonding tools in wedge bonding with gold wire, where similar bonding tool wear problems exist. The embodiment was chosen and described in order to best explain the principles of the invention and its practical application to thereby enable others skilled in the art to best utilize the invention in various embodiments and modifications as are suited to the particular use contemplated. It is intended that the appended claims be construed to include other alternative embodiments of the invention except insofar as limited by the prior art.

What is claimed is:

1. A tape automated or wedge bonding tool for ultrasonically or thermosonically forming a bond between a lead and a contact pad of an electronic device or circuit, said bonding tool comprising:

a shank, said shank having a first end and a second end; and a tapered bonding tip composed substantially of aluminum oxide without metallic binders, said bonding tip being located at said first end of said shank, said bonding tip having a microscopically rough surface such that when said bonding tip comes into compressive contact with a lead, said microscopically rough surface grabs said lead and said bonding tool ultrasonically or thermosonically moves said lead across said contact pad, forming a bond between said lead and said contact pad.

2. The tape automated or wedge bonding tool according to claim 1 wherein said shank is composed substantially of Aluminum Oxide ceramic.

3. The tape automated bonding tool according to claim 1 wherein said bonding tip is composed substantially of 99.99% pure sintered Aluminum Oxide ceramic without metallic binders.

4. The tape automated or wedge bonding tool according to claim 3 wherein said microscopically rough surface of said bonding tip comprises a raised ring slightly smaller in size than said contact pad.

5. The tape automated or wedge bonding tool according to claim 3 wherein said microscopically rough surface of said bonding tip comprises a plurality of raised fingers running across said surface.

6. The tape automated or wedge bonding tool according to claim 3 wherein said microscopically rough surface of said bonding tip comprises an omnidirectional, raised pattern that is capable of grabbing and moving said lead when brought into ultrasonic, compressive contact therewith.

* * * * *